United States Patent [19]

Bechteler et al.

[11] Patent Number: 4,951,109
[45] Date of Patent: Aug. 21, 1990

[54] TURN-OFF POWER SEMICONDUCTOR COMPONENT

[75] Inventors: Martin Bechteler, Kirchheim; Wolfgang Gross, Unterfoehring, both of Fed. Rep. of Germany

[73] Assignee: Siemens Aktiengesellschaft, Berlin and Munich, Fed. Rep. of Germany

[21] Appl. No.: 165,874

[22] Filed: Mar. 9, 1988

[51] Int. Cl.$^5$ ............................................. H01L 29/74
[52] U.S. Cl. ............................................. 357/38; 357/39
[58] Field of Search ............................................. 357/38, 39

[56] References Cited

U.S. PATENT DOCUMENTS 4,177,478 12/1979 Sénés ............................................. 357/38
4,574,296 3/1986 Sueoka et al. ............................................. 357/38

FOREIGN PATENT DOCUMENTS 54-38777 3/1979 Japan ............................................. 357/38 R

OTHER PUBLICATIONS

Patent Abstracts of Japan, vol. 5, No. 145, 9/81, No. 56-80163.
Fukui et al., "Two-Dimensional Numerical Analysis . . . ", 9/85, pp. 1830 to 1834.

Primary Examiner—Rolf Hille
Assistant Examiner—Steven Loke
Attorney, Agent, or Firm—John F. Moran; Eugene S. Indyk

[57] ABSTRACT

Conventional turnoff power semiconductor devices each comprise a p-n junction blocking in case of turnoff, one zone of which, lying at the p-n junction, has a high doping gradient. But this produces a low dynamic voltage stability characteristic for the power semiconductor device. To increase the dynamic voltage stability characteristic of the power semiconductor device, it is proposed to provide one zone in the form of a region having at least a width of twenty microns viewed from the p-n junction, wherein a maximum doping gradient $dN_2/dx = 5 \times 10^{16}$ cm$^{-4}$ and a predetermined basic dopant concentration is present.

14 Claims, 1 Drawing Sheet

TURN-OFF POWER SEMICONDUCTOR COMPONENT

BACKGROUND OF THE INVENTION

This invention relates to a turn-off power semiconductor device in a semiconductor body having at least two contiguous zones of opposite conductivity type which in case of turnoff form a blocking p-n junction, and one zone of which has a constant dopant concentration ($N_1$).

A turn-off power semiconductor component of this kind is described, e.g., in the IEEE, Transactions on Electronic Devices, Vol. ED-32, No. 9, 1985, p. 1830 ff. In FIG. 1 of this article, a typical doping profile of a gate turn-off (GTO) thyristor is illustrated. This GTO thyristor has a wide and uniformily weakly n-doped base zone, on one side of which also borders a narrow p-doped emitter zone provided with a very high doping gradient. Adjacent to the other side of the weakly n-doped base zone is a narrow p-doped base zone, also having a very high doping gradient, which is connected to a gate electrode. Contiguous to this heavily p-doped base zone is an emitter zone having a still higher n-doped concentration. The basic shape of the doping profile of such a GTO thyristor is represented in FIG. 1 of the present application.

Among conventional practices, e.g. from "Der Elektroniker", No. 11, 1985, p. 44 ff, there is the practice to connect in parallel with the GTO thyristor a so-called wiring capacitor. This wiring capacitor serves the purpose of limiting the positive rate of rise of off-state voltage upon turnoff of the GTO thyristor. Often this wiring capacitor has connected in series with it additionally a diode shunted by a parallel-connected resistor. Such an arrangement is generally known by the terms "RCD wiring" or "Snubber Circuit".

By applying a negative control pulse to the gate terminal of a conventional GTO thyristor, the latter can be extinguished, that is, turned off. In the turnoff process, after the end of the storage period, no further electrons are delivered by the n-emitter, so that in the semiconductor body a pure hole-current develops from the n-base zone via the p-base zone to the gate electrode. The space charge of these holes, which move approximately at saturation speed ($v_s = 10^7$ cm/sec in silicon), is added to the space charge that exists through the doping of the semiconductor body. There then results in a shift in the location of the electric field peak from the doped p-n junction into the p-base zone, namely up to the point where the dopant concentration $N_A$ of the p-base zone corresponds exactly to the hole density. In addition, due to the alteration of the space charge there results in a contraction of the space-charge zone in the n-base zone or respectively an expansion of the space-charge zone in the p-base zone.

For the known doping profiles of the p-base zone with high doping gradients and the high current densities occurring in the practice (e.g. 100 A/cm$^2$), this high doping gradient is so high that the expansion of the space-charge zone in the p-base zone cannot compensate for the contraction of the space-charge zone in the n-base zone. Accordingly, the voltage stability is reduced. Since during the fall period the current commutes upon turnoff of the GTO thyristor at up to several 1000 A/microsec into the RCD wiring, high voltage peaks caused by the parasitic RCD inductances will occur at still high current flow through the semiconductor body. Due to the low dynamic voltage stability, this may lead to destruction of the GTO thyristor.

The same problem occurs in principle in all semiconductor components including a p-n junction which is to be depleted quickly during current commutation, as for example in diodes or in bipolar transistors which are turned off by inversion of the base activation.

SUMMARY OF THE INVENTION

It is an object of the invention to increase the dynamic voltage stability in turn-off power semiconductor components.

This problem is solved by providing another zone having a region at least twenty microns wide (20,$\mu$m = 20 × 10$^{-6}$ m) contiguous to the p-n junction, that this region has a basic dopant concentration $N_2 = j/(e^*v)$ wherein j is the maximum current density in the case of turnoff for a distribution assumed to be homogeneous, while e is the elementary charge, and v is a saturation velocity of 10$^7$ cm/sec, and that in this region a maximum doping gradient $dN_2/dx = 5 \times 10^6$ cm$^{-4}$ as viewed from the p-n junction is not exceeded.

In one illustrative embodiment of a turn-off power semiconductor device in accordance with the inventive principles, it is achieved that in response to a turnoff condition the space charge of the charge carriers flowing through the semiconductor body near the p-n junction is being compensated by the stationary space charge of the doping and thereby an extensive zone of high field strength is produced and hence a high dynamic voltage stability is ensured.

In some of the further aspects of the present invention, the region has a width of at least thirty microns. The region may be in the form of a diffused zone or an epitaxial zone. In the other zone adjacent to the region, a more highly doped layer of the same conductivity type as the rest of the other zone may be present. In addition, adjacent to the more highly doped layer is a layer of lower doping but having a higher doping concentration than the doping concentration in the region. The power semiconductor device in accordance with illustrative embodiments of the invention may be in the form of a thyristor, a diode or a bipolar transistor.

The GTO thyristor here has n+pn-p+ structure, its p-base zone being connected to a gate electrode.

Figure 2:
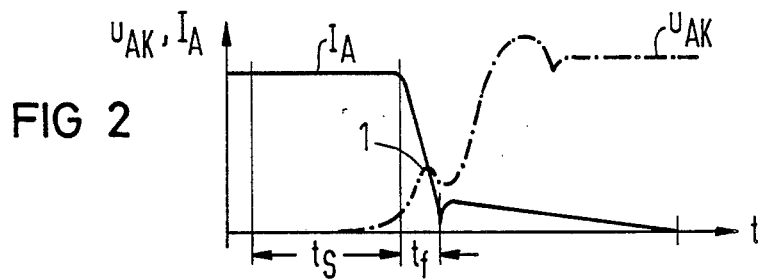
Figure 3:
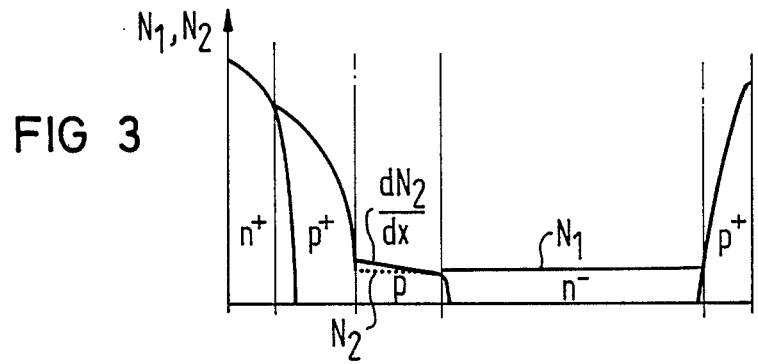
Figure 4:
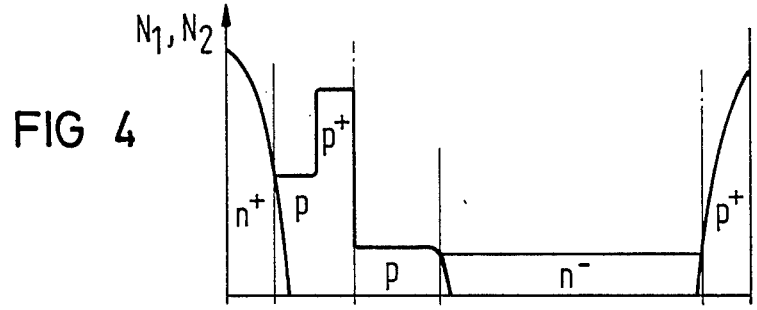

FIG. 2 shows a typical anode-current and anode-cathode voltage response exhibited during the turnoff period of a GTO thyristor with RCD wiring and an inductive load;

FIG. 3 illustrates a first doping profile of a first illustrative embodiment of a GTO thyristor according to the invention; and FIG. 4 depicts a second doping profile of a second illustrative embodiment of a GTO thyristor in accordance with the invention.

DETAILED DESCRIPTION OF THE DRAWING

The theoretical turnoff behavior of a GTO thyristor with RCD wiring and inductive load is represented by the curve of the anode current $I_A$ shown in FIG. 2 and by the anode-cathode voltage curve $U_{AK}$, drawn as a dash-dotted line. After application of a reverse control voltage required for turnoff of the current-carrying GTO thyristor at the gate-cathode path thereof, a reverse control current builds up. Until the time when the reverse control current is great enough, the anode current response $I_{AK}$ does not change. This is what is called the storage period $t_S$ in case of turnoff. If the reverse control current is great enough, a steep drop of the anode current $I_A$ with a negative slope of up to several 1000 A/microsec occurs. This is indicated in FIG. 2 as the fall period $t_f$. Due to the inductances of the RCD wiring (parasitic inductances and lead inductances), high and steep voltage peaks are produced. Therefore, the components of the RCD wiring must be selected and constructed so that the first voltage peak 1 does not exceed a value determined or limited by the structure of the GTO thyristor. In fact, a high voltage while a high anode current is still flowing has the consequence, besides a high thermal load, of a high electric field peak in the p-base zone, which leads to a resulting local breakdown of the p-n junction of the base zones and hence generally to destruction of the GTO thyristor.

After the end of the storage period $t_S$ such as shown in FIG. 2, no further electrons are emitted by the n+ —emitter zone, and the current flowing in the semiconductor body flows as a pure hole current from the n-base zone via the p-base zone to the gate electrode. The space charge of these hole electrons is added to the space charge that exists through the doping of the n-base zone and p-base zone. This results in a shift of the electric field peak from the doped p-n junction into the p-base zone, where the dopant concentration $N_2$ of the p-base zone corresponds exactly to the hole density of the flowing hole current. In addition, the breadth of the space-charge zone in the n-base zone is reduced according to $dE/dx = K \times (N_1 + /p/)$ in the n-base zone, with $N_1$ being the value of dopant concentration of the n-base zone and p being hole density. The space-charge zone in the p-doped base zone, on the other hand, expands according to $-dE/dx = (N_2 - /p/) \times K$. Here K is a constant factor.

Figure 1:
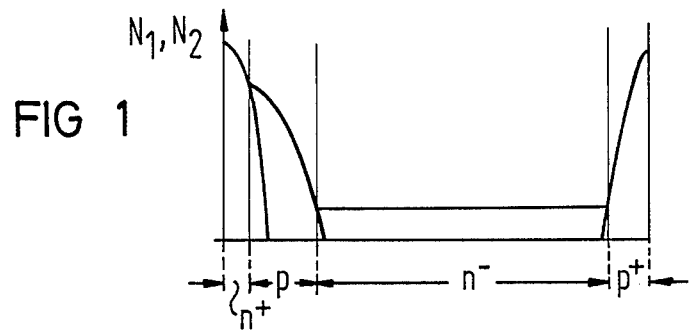
FIG. 1 depicts a typical conventional doping concentration profile while the invention will be explained more specifically with reference to the following FIG. 2 through 4. As an illustrative embodiment of a power semiconductor component there is described a GTO thyristor which is designed according to the principles of the invention.

In FIG. 3, the doping profile of a GTO thyristor is demonstrated in accordance with the invention. This doping profile differs from that of conventional GTO thyristor, as shown in FIG. 1 by the doping of the p-base zone. The p-base zone comprises a region having a width of at least 20 microns ($\mu$m) as viewed from the pn junction of the base zones, advantageously 30 $\mu$m wide, in which a maximum doping gradient $dN_2/dx = 5 \times 10^{16}$ cm$^{-4}$ is not exceeded. This region has a basic dopant concentration of $N_2 = j/(e \times v)$. Here j = maximum current density in case of turnoff at current distribution assumed to be homogeneous, e (elementary charge = $1.6 \times 10^{-19}$ Coulombs, and v (saturation velocity of the charge carriers in the semiconductor body) = $10^7$ cm/sec. Due to the fact that the region is at least 20/$\mu$m wide, good dynamic voltage stability as well as good ignition properties of the thyristor are ensured.

The absolute value of the doping in the p-base zone near the p-n junction blocking in case of turnoff is thus selected so that the compensation point $N_2 = p$ lies near the p-n junction with the current density of the current to be turned off being assumed homogeneous.

An example will illustrate the doping profile in this region:

When the effective surface of the semiconductor body in the case of turnoff is selected to be 25 cm$^2$ and a current of 2200 A is to be turned off, the result is a current density $j = 88$ A/cm$^2$ when the current distribution is assumed to be homogeneous. For the hole density p there results according to $p = j/(e \times v)$ a value of $5.5 \times 10^{13}$ cm$^{-3}$. If in a region having a width of at least 20$\mu$m wide the dopant concentration $N_2$ in the p-base zone corresponds exactly to this value, the space charge of the doping will be compensated with the space charge of the flowing holes in this region, which means that in this region the space charge has the value zero. Thereby a zone of high field strength of at least 20,$\mu$m is obtained and hence the achievement of a high dynamic voltage stability is ensured.

As the local current density is not known exactly because of inhomogeneities of the doping in the semiconductor body, and as the local current density j is moreover time-dependent, there is provided in this region a maximum permissible doping gradient $dN_2/dx = 5 \times 10^{16}$ cm$^{-4}$, which means that at the spacing of 20,$\mu$m from the p-n junction of the base zones a maximum dopant concentration of $10^{14}$ cm above that of the basic dopant concentration $N_A$ may be present.

In the representation of FIG. 3 the region at least 20$\mu$m wide is followed by a highly doped p-base region. Due to this, a good transverse conductivity under the n-emitter zone is ensured.

FIG. 4 is an illustration a further example of a doping profile for a GTO thyristor. The basic difference from the doping profile of FIG. 3, as it is shown in FIG. 4, is that adjacent to the at least 20 $\mu$m wide region a highly doped p region is arranged to preserve the transverse conductivity and between this highly doped p region and the very highly doped n-emitter zone a further difference is that an additional p-doped base region is arranged. The dopant concentration of this p-base region is lower than the dopant concentration in the previously mentioned highly doped base region, but higher than that in the at least 20 $\mu$m wide p-base region. The advantage of this is that the breakdown voltage between n-emitter zone and p-base zone is largely independent of the depth of penetration of the n-emitter zone and of the selection of the transverse conductivity of the p-base zone.

The zone having at least 20 $\mu$m wide region is either applied using epitaxial techniques on the p-base zone or may be introduced into the semiconductor body by diffusion. For this diffusion, it is desirable to provide for diffusion of a rapidly diffusing material, for example, aluminum. The highly doped p-base region is introduced into the semiconductor body by diffusion of a slowly diffusing material, typical examples being gallium or boron, or is applied by epitaxial techniques on the p-base region which has the maximum permissible doping gradient.

In accordance with the principles of the invention, not only is it possible to increase the dynamic voltage stability of GTO thyristors, but any power semiconductor device or component having a p-n junction which upon current commutation must be emptied quickly, as for instance in the case of diodes or bipolar transistors which are turned off by inversion of the base activation or thyristors with turnoff aid, can be improved in its dynamic voltage stability.

This is accomplished if the p-n junction blocking in case of turnoff, or respectively the zones of different conductivity type forming the p-n junction, are designed according to the principles of the invention.

There has thus been shown and described novel power semiconductor devices which fulfill all the objects and advantages sought therefor. Many changes, modifications, variations and other uses and applications of the subject invention will, however, become apparent to those skilled in the art after considering this specification and the accompanying drawing which disclose the preferred embodiments thereof. All such changes, modifications, variations and other uses and applications which do not depart from the spirit and scope of the invention are deemed to be covered by the invention which is limited only by the claims which follow.

We claim:

1. A turnoff power semiconductor device having a semiconductor body, the device comprising:
    at least two contiguous zones of opposite conductivity type that form a blocking p-n junction when subject to a turnoff condition, one zone having a constant dopant concentration ($N_1$), and the other zone having a region at least $20 \times 10^{-6}$ m wide contiguous with the p-n junction;
    the region having a basic dopant concentration $N_2 = j/(e^*v)$ with j=maximum current density at turnoff, e=elementary charge, and $v = 10^7$ cm/sec; and
    this region having a maximum doping gradient of $dN_2/dx = 5 \times 10^{16}$ cm$^{-4}$.

2. A turnoff power semiconductor device in accordance with claim 1, characterized in that the region is wider than 30 μm.

3. A turnoff power semiconductor device according to claim 1, characterized in that the region on the other zone is an epitaxial region.

4. A turnoff power semiconductor device according to claim 2, characterized in that the region on the other zone is an epitaxial region.

5. A turnoff power semiconductor device according to claim 1, characterized in that the region is a diffused region in the semiconductor body.

6. A turnoff power semiconductor device according to claim 2, characterized in that the region is a diffused region in the semiconductor body.

7. A turnoff power semiconductor device according to claim 1, characterized in that adjacent to the region and in the other zone is a more highly doped layer of the same conductivity type as in the rest of the other zone.

8. A turnoff power semiconductor device according to claim 2, characterized in that adjacent to the region and in the other zone is a more highly doped layer of the same conductivity type as in the rest of the other zone.

9. A turnoff power semiconductor device according to claim 3, characterized in that adjacent to the region and in the other zone is a more highly doped layer of the same conductivity type as in the rest of the other zone.

10. A turnoff power semiconductor device according to claim 4, characterized in that adjacent to the region and in the other zone is a more highly doped layer of the same conductivity type as in the rest of the other zone.

11. A turnoff power semiconductor device according to claim 7, characterized in that adjacent to the more highly doped layer is a layer of low doping, but whose dopant concentration is greater than the dopant concentration of the region.

12. A turnoff power semiconductor device according to one of claims 1 to 3, 5 and 7, characterized in that the semiconductor body forms a thyristor.

13. A turnoff power semiconductor according to one of claims 1 to 3, 5 and 7, characterized in that the semiconductor body forms a diode.

14. A turnoff power semiconductor component according to one of claims 1 to 3, 5 and 7, characterized in that the semiconductor body forms a bipolar transistor.

* * * * *

UNITED STATES PATENT AND TRADEMARK OFFICE
CERTIFICATE OF CORRECTION

PATENT NO. : 4,951,109

DATED : Aug. 21, 1990

INVENTOR(S) : Bechteler et al.

It is certified that error appears in the above-identified patent and that said Letters Patent is hereby corrected as shown below:

<u>Column 2</u>
Line 22: delete "$5 \times 10^6$" and insert therefor --$5 \times 10^{16}$--.

<u>Column 4</u>
Line 17: delete "20,µ" and insert therefor --20µ--.
Line 26: delete "20,µ" and insert therefor --20µ--.

Signed and Sealed this

Ninth Day of February, 1993

Attest:

STEPHEN G. KUNIN

*Attesting Officer*  Acting Commissioner of Patents and Trademarks